United States Patent
Lee et al.

(10) Patent No.: US 11,942,956 B2
(45) Date of Patent: Mar. 26, 2024

(54) TIME-TO-DIGITAL CONVERTER AND DIGITAL PHASE-LOCKED LOOP CIRCUIT COMPRISING THE SAME

(71) Applicant: Samsung Electronics Co., Ltd., Suwon-si (KR)

(72) Inventors: Min Seob Lee, Yongin-si (KR); Shin Woong Kim, Yongin-si (KR); Joon Hee Lee, Goyang-si (KR); Sang Wook Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 33 days.

(21) Appl. No.: 17/885,844

(22) Filed: Aug. 11, 2022

(65) Prior Publication Data

US 2023/0163768 A1      May 25, 2023

(30) Foreign Application Priority Data

Nov. 25, 2021 (KR) .......................... 10-2021-0164222
Apr. 4, 2022 (KR) .......................... 10-2022-0041546

(51) Int. Cl.
    *H03L 7/099*      (2006.01)
    *H03L 7/093*      (2006.01)
    *H03M 1/10*      (2006.01)

(52) U.S. Cl.
    CPC ............ *H03L 7/0992* (2013.01); *H03L 7/093* (2013.01); *H03L 7/0995* (2013.01); *H03M 1/1014* (2013.01)

(58) Field of Classification Search
CPC ..... H03L 7/0992; H03L 7/093; H03L 7/0995; H03L 7/085; H03L 7/087; H03M 1/1014; H03M 1/1052; H03M 1/50; G04F 10/005
See application file for complete search history.

(56) References Cited

U.S. PATENT DOCUMENTS

| | | |
|---|---|---|
| 8,508,266 B2 | 8/2013 | Frantzeskakis et al. |
| 8,570,082 B1 | 10/2013 | Kuo et al. |
| 8,791,733 B2 | 7/2014 | Tertinek et al. |
| 9,207,646 B2 | 12/2015 | Wang et al. |
| 9,774,336 B2 | 9/2017 | Liu |
| 10,419,007 B2 | 9/2019 | Gao |
| 10,623,010 B2 | 4/2020 | Loke et al. |

*Primary Examiner* — Vineeta S Panwalkar
(74) *Attorney, Agent, or Firm* — Harness, Dickey & Pierce, P.L.C.

(57) ABSTRACT

Provided is a time-to-digital converter, comprising a phase frequency detector configured to receive a phase-locked loop input clock and a feedback clock, a ring oscillator configured to perform oscillation with multi-phase clocks of a first period, a counter array configured to count the number of oscillations in which the ring oscillator oscillates in a first period by the number of positive integers during the first pulse width, a multiplexer configured to divide the first period into a plurality of zones using edge information of the multi-phase clocks of the ring oscillator, and selects and outputs voltage information of a plurality of neighboring phase clocks included in a first zone from the plurality of zones, an analog-to-digital converter, a calibrator, and a first adder, wherein the calibrator comprises, an offset lookup table generation circuit, a gain-corrected analog-to-digital conversion output generator, and a second adder.

20 Claims, 12 Drawing Sheets

TIME-TO-DIGITAL CONVERTER AND DIGITAL PHASE-LOCKED LOOP CIRCUIT COMPRISING THE SAME

CROSS-REFERENCE TO RELATED APPLICATIONS

This application claims priority from Korean Patent Applications No. 10-2021-0164222 filed on Nov. 25, 2021 and No. 10-2022-0041546 filed on Apr. 4, 2022 in the Korean Intellectual Property Office, and all the benefits accruing therefrom under 35 U.S.C. 119, the contents of which in their entirety are herein incorporated by reference.

BACKGROUND

1. Technical Field

The present disclosure relates to a time-to-digital converter (TDC) and a digital phase-locked loop circuit comprising the same.

2. Description of the Related Art

A time-to-digital converter (TDC) is a device capable of providing a digital representation of the time at which an event occurs. The time-to-digital converter may determine a time interval between two signal pulses (e.g., a start pulse and a stop pulse). For example, the time-to-digital converter may generate a digital code by receiving a delayed clock signal as an input by delaying a reference clock signal.

A digital phase-locked loop circuit (e.g., an all-digital phase-locked loop (ADPLL) circuit) may include a time-digital converter, a digital loop filter, a digital-controlled oscillator DCO, and a distributor. The time-to-digital converter may introduce quantization noise into the digital phase-locked loop circuit. Accordingly, a high-resolution time-digital converter may be beneficial for a low-phase noise phase-locked loop. An analog-to-digital converter (ADC) may be used to improve the resolution of the time-to-digital converter. In addition, a ring oscillator may be included in the time-to-digital converter.

However, nonlinearity may occur in the digital code output via the time-digital converter due to nonlinearity generated by the analog-digital converter and a multi-phase mismatch caused by multi-phase information generated by the ring oscillator.

SUMMARY

Example embodiments provide a time-to-digital converter from which nonlinearity is removed.

Example embodiments provide a digital phase-locked loop circuit comprising a time-to-digital converter from which nonlinearity is removed.

According to some example embodiments of the present inventive concepts, there is provided a time-to-digital converter, comprising, a phase frequency detector configured to receive a phase-locked loop input clock CKREF and a feedback clock CKFB and generate an enable signal during a first pulse width in which a phase error occurs between the phase-locked loop input clock and the feedback clock, a ring oscillator configured to be turned on based on the enable signal and configured to perform oscillation with multi-phase clocks of a first period P_RO, a counter array configured to count a number of oscillations N_CNT in which the ring oscillator oscillates in the first period by the number of positive integers during the first pulse width, a multiplexer configured to divide the first period into a plurality of zones using edge information of the multi-phase clocks of the ring oscillator, and selects and outputs voltage information of a plurality of neighboring phase clocks included in a first zone N_ZONE from the plurality of zones, an analog-to-digital converter configured to generate an analog-to-digital conversion output ADC_OUT by receiving the voltage information included in the first zone as an input, a calibrator configured to receive the analog-to-digital conversion output and a loop filter input signal and generate a calibrated analog-to-digital conversion output ADC_OUT_CAL by calibrating the analog-to-digital conversion output, and a first adder configured to output the loop filter input signal by receiving the first zone, the number of oscillations, and the calibrated analog-to-digital conversion output, wherein the calibrator comprises, an offset lookup table generation circuit configured to receive the loop filter input signal LF_IN and generate a plurality of offset lookup tables that offset an error between an ideal digital code value and a nonlinear digital code value over time of the loop filter input signal, a gain-corrected analog-to-digital conversion output generator circuit configured to generate a gain-corrected analog-to-digital conversion output ADC_OUT_MULT that offsets a difference between a first gain having the ideal digital code value and a second gain with the nonlinear digital code value, and a second adder configured to generated the calibrated analog-to-digital conversion output ADC_OUT_CAL by adding the offset lookup table and the gain-corrected analog-to-digital conversion output.

According to some example embodiments of the present inventive concepts, there is provided a digital phase-locked loop circuit comprising a time-to-digital converter for generating a loop filter input signal, the digital phase-locked loop circuit comprising, the time-to-digital converter configured to generate the loop filter input signal LF_IN by receiving a phase-locked loop input clock and a feedback clock, a loop filter configured to generate an output signal LF_OUT by receiving the loop filter input signal, an oscillator DCO configured to generate an oscillation clock CKDCO by receiving the output signal, and a divider configured to generates the feedback clock that divides a frequency of the oscillation clock by receiving the oscillation clock, wherein the time-to-digital converter comprises, a phase frequency detector configured to receive the phase-locked loop input clock CKREF and the feedback clock CKFB and output an enable signal during a first pulse width in which a phase error occurs between the phase-locked loop input clock and the feedback clock, a ring oscillator configured to be turned on based on the enable signal and configured to perform oscillation with multi-phase clocks of a first period P_RO, a counter array configured to count the number of oscillations N_CNT in which the ring oscillator oscillates in the first period by the number of positive integers during the first pulse width, a multiplexer configured to divide the first period into a plurality of zones using edge information of the multi-phase clocks of the ring oscillator, and selects and outputs voltage information of a plurality of neighboring phase clocks included in a first zone N_ZONE from the plurality of zones, an analog digital converter configured to generate an analog-to-digital conversion output ADC_OUT by receiving the voltage information included in the first zone as an input, a calibrator configured to receive the analog-to-digital conversion output and the loop filter input signal and generate a calibrated analog-to-digital conversion output ADC_OUT_CAL by calibrating the analog-to-digital conversion output, and a first adder configured to output the loop filter input signal by receiving the first zone, the number of oscillations, and the calibrated analog-to-digital conversion output, wherein the calibrator comprises, an offset lookup table generation circuit configured to receive the loop filter input signal LF_IN and generate a plurality of offset lookup tables that offset an error between an ideal digital code value and a nonlinear digital code value over time of the loop filter input signal, a gain-corrected analog-to-digital conversion output generator circuit configured to generate a gain-corrected analog-to-digital conversion output ADC_OUT_MULT that offsets a difference between a first gain having the ideal digital code value and a second gain with the nonlinear digital code value, and a second adder configured to generate the calibrated analog-to-digital conversion output ADC_OUT_CAL by adding the offset lookup table and the gain-corrected analog-to-digital conversion output.

According to some example embodiments of the present inventive concepts, there is provided a calibrator included in a digital phase-locked loop circuit, the calibrator configured to calibrate a loop filter input signal of a time-to-digital converter for outputting the loop filter input signal based on an analog to digital conversion. The calibrator comprises, an offset lookup table generation circuit configured to receive the loop filter input signal (LF_IN) and generate a plurality of offset lookup tables ($Offset_N[M]$) that offset an error between an ideal digital code value and a nonlinear digital code value over time of the loop filter input signal, a gain-corrected analog-to-digital conversion output generator circuit configured to generate a gain-corrected analog-to-digital conversion output ADC_OUT_MULT that offsets a difference between a first gain having the ideal digital code value and a second gain with the nonlinear digital code value, and a first adder configured to generate a calibrated analog-to-digital conversion output ADC_OUT_CAL by calibrating an analog-to-digital conversion output by adding the offset lookup table and the gain-corrected analog-to-digital conversion output, wherein the calibrator is configured to output the calibrated analog-to digital conversion output to the time-to-digital converter for calibrating the loop filter input signal using the calibrated analog-to-digital conversion output.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

BRIEF DESCRIPTION OF THE DRAWINGS

The above and other example embodiments and features of the present disclosure will become more apparent by describing in detail exemplary embodiments thereof with reference to the attached drawings, in which.

DETAILED DESCRIPTION OF THE EXAMPLE EMBODIMENTs

Hereinafter, example embodiments of the present disclosure will be described with reference to the attached drawings.

The components described in the present disclosure (e.g., units, circuits, dividers, converters, oscillators, detectors, etc.) may be implemented with hardware, but the present disclosure is not limited thereto. The components may be implemented with software or a combination of hardware and software. For example, the circuit may be implemented as a digital circuit as well as an analog circuit.

Figure 1:
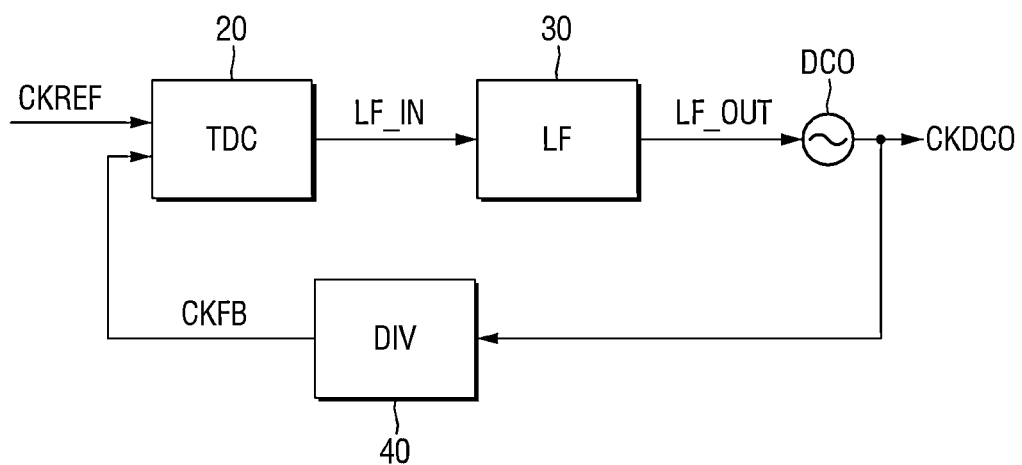
FIG. 1 is a block diagram illustrating a digital phase-locked loop according to some example embodiments.

FIG. 1 is a block diagram illustrating a digital phase-locked loop according to some example embodiments.

Referring to FIG. 1, a digital phase-locked loop 1 includes a time-to-digital converter 20, an oscillator DCO, and a divider 40.

The time-digital converter 20 may receive a phase-locked loop input clock CKREF and a feedback clock CKFB and detect a phase difference between the phase-locked loop input clock CKREF and the feedback clock CKFB.

A loop filter 30 may receive a loop filter input signal LF_IN generated based on the phase difference detected by the time-digital converter 20 and generate an output signal LF_OUT to be applied to the oscillator DCO. The loop filter input signal LF_IN input to the loop filter 30 and the output signal LF_OUT output by the loop filter 30 may be digital codes (e.g., digital codes formed of multi bits). The output signal output signal LF_OUT may be a digital code generated based on the phase difference detected by the time-digital converter 20.

The oscillator DCO may receive the output signal LF_OUT and generate the oscillation clock CKDCO. The oscillator DCO may be implemented, for example, as a digitally controlled oscillator DCO.

The divider 40 may receive the oscillation clock CKDCO and generate the feedback clock CKFB obtained by dividing a frequency of the oscillation clock CKDCO by an integer or a fraction.

Figure 2:
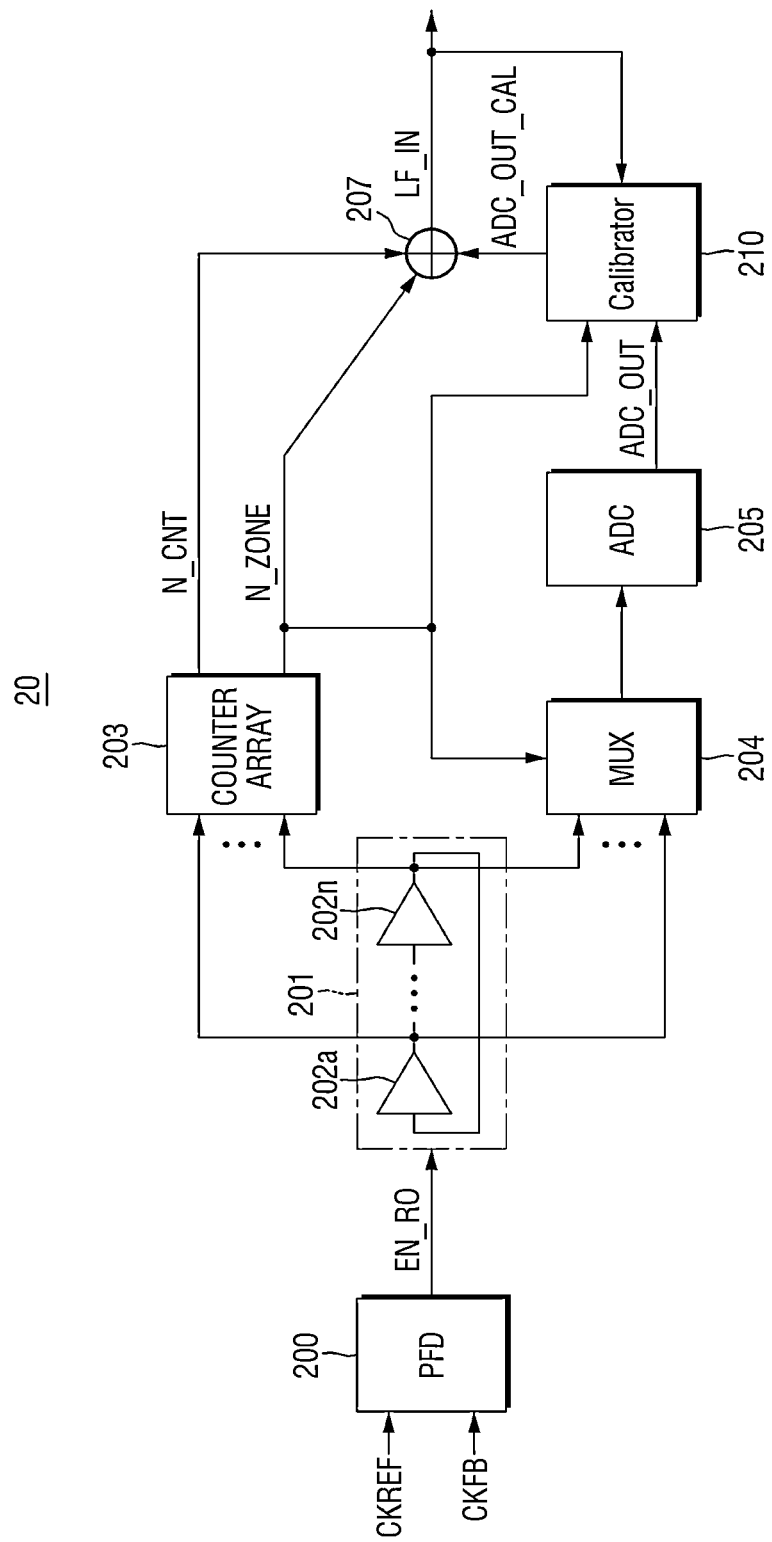
FIG. 2 is a block diagram illustrating a time-to-digital converter according to some example embodiments.
Figure 3:
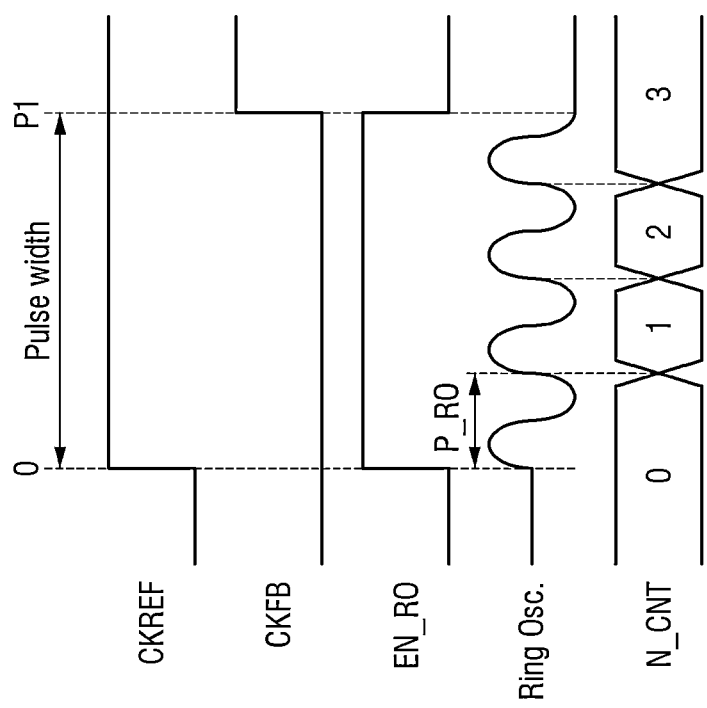
FIG. 3 is a timing view explaining an operation of the time-to-digital converter according to some example embodiments.
Figure 4:
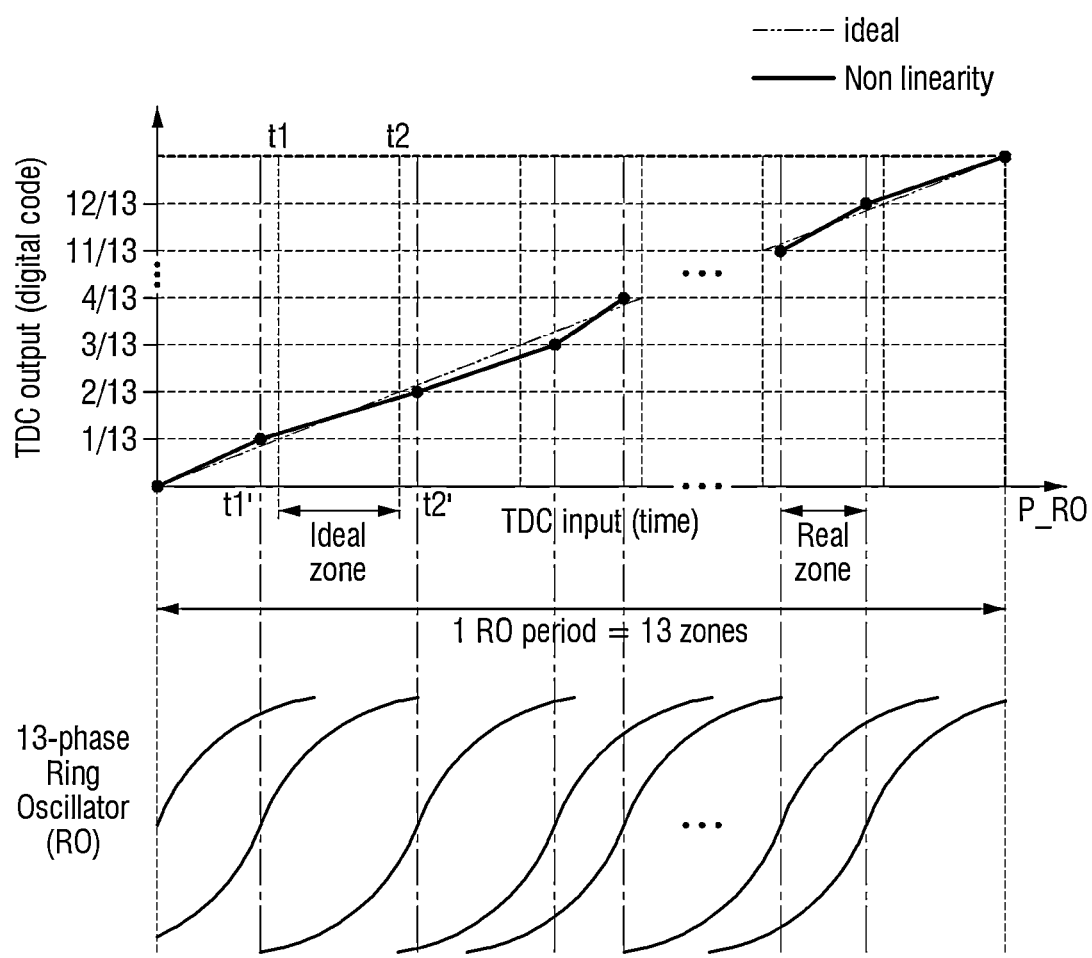
FIG. 4 is a graph explaining nonlinearity generated in the time-to-digital converter.

FIG. 2 is a block diagram illustrating a time-to-digital converter according to some example embodiments. FIG. 3 is a timing view explaining an operation of the time-to-digital converter according to some example embodiments. FIG. 4 is a graph explaining nonlinearity generated in the time-to-digital converter.

Referring to FIG. 2, the time-to-digital converter 20 includes a phase frequency detector (PFD) 200, a ring oscillator 201, a counter array 203, a multiplexer (MUX) 204, an analog-to-digital converter (ADC) 205, a calibrator 210, and an adder 207.

The phase frequency detector 200 receives the phase-locked loop input clock CKREF and the feedback clock CKFB. The phase frequency detector 200 may generate a ring oscillator enable signal EN_RO that enables the ring oscillator 201.

The ring oscillator 201 includes a plurality of inverters 202a to 202n connected in series.

Although not illustrated, the time-to-digital converter (20) according to some example embodiments may further include, for example, an XOR gate configured to generate pulses with a duration indicative of the phase difference by receiving two signals (e.g., an UP signal and a DOWN signal) generated by detecting the phase difference between the phase-locked loop input clock CKREF and the feedback clock CKFB generated by the phase frequency detector 200, and a flip-flop configured to detect a polarity of the phase difference between the phase-locked loop input clock CKREF and the feedback clock CKFB generated by the phase frequency detector 200, based on a relative time of a rising or falling edge.

Outputs of each of the plurality of inverters 202a to 202n in the ring oscillator 201 may be connected to the counter array 203 and the multiplexer 204. The ring oscillator 201 may perform oscillation with multiple phases. Alternatively, the ring oscillator 201 may perform oscillation with multi-phase clocks.

The counter array 203 may generate the number of oscillations N_CNT by counting the number of times that the ring oscillator 201 oscillates in a certain period, as the number of positive integers, during a pulse width at which the ring oscillator 201 is turned on. In addition, the counter array 203 may generate a plurality of zones N_ZONE by dividing one count or one cycle of the number of oscillations N_CNT that occur as the number of positive integers into a plurality of zones using multi-phase information (or voltage information of multi-phase clocks).

This will be described with reference to FIG. 3.

Referring to FIGS. 2 and 3, a first pulse width in which the phase difference occurs between the phase-locked loop input clock CKREF and the feedback clock CKFB may be formed from 0 to P1.

The ring oscillator enable signal EN_RO that turns on the ring oscillator 201 during the first pulse width may be generated. That is, the ring oscillator 201 may be turned on during the first pulse width to perform oscillation.

In this case, the ring oscillator 201 may perform oscillation in a first period PRO.

The counter array 203 may count the number of times that the ring oscillator 201 oscillates during the first pulse width. The counter array 203 connected to the outputs of each of the plurality of inverters 202a to 202n included in the ring oscillator 201 may generate the number of oscillations N_CNT of a positive integer in which the number of oscillations is counted in the first period P_RO during the first pulse width. In addition, the counter array 203 may generate the plurality of zones N_ZONE by dividing one count (e.g., when N_CNT=0) or one cycle (e.g., during a P_RO period of N_CNT=0) of the number of oscillations N_CNT that occurs as the number of positive integers into the plurality of zones, using multi-phase information, through which counting may be performed.

For example, when the ring oscillator 201 performs three or more and less than four oscillations in the first period P_RO during the first pulse width, the counter array 203 may output the number of oscillations N_CNT counted from 0 to 3. In addition, the number of oscillations for the plurality of zones N_ZONE that are further subdivided during the first period P_RO period may be output by counting the number of oscillations at all the rising edges of the multi-phase clocks.

In other words, the number of oscillations N_CNT to digital output values counted in an integer cycle and the number of oscillations for the plurality of zones N_ZONE may be generated by the counter array 203.

The ring oscillator 201 may perform an oscillation operation with multiple phases. It will be described with reference to FIG. 4 together.

Referring to FIGS. 2 to 4, the ring oscillator 201 may perform oscillation with, for example, 13 phases in the first period PR_RO. In this case, while the ring oscillator 201 oscillates during the first pulse width, an oscillation width between two different neighboring phases may not be constant. In other words, a multi-phase mismatch may occur. For this reason, a time-digital converter output (TDC output) value for a time-digital converter input (TDC input) (e.g., the phase difference between the phase-locked loop input clock CKREF and the feedback clock CKFB may have nonlinear characteristics.

For example, within a first ring oscillation period 1 RO period, an ideal interval between multiple phases may be an ideal zone interval from a first time t1 to a second time t2. However, an actual zone interval may be from a first' time t1' to a second' time t2' due to the multi-phase mismatch described above.

For this reason, a time-digital converter output (TDC output) graph for the time-digital converter input (TDC input) does not have an ideal value such as a dotted line, and may have nonlinear characteristics such as a solid line.

In other words, the plurality of zones that are intervals between the multiple phases may be formed during the first ring oscillation period 1 RO period. For example, a digital code indicative of one zone N_ZONE among the plurality of zones may be output by the counter array 203 connected to the outputs of each of the plurality of inverters 202a to 202n of the ring oscillator 201. In addition, the output of each of the plurality of inverters 202a to 202n may be connected to the multiplexer 204 to select voltage information of a plurality of neighboring phase signals included in the one zone N_ZONE of the plurality of zones and transmit the selected voltage information to an analog-digital converter 205. Through the multiplexer 204, the one zone N_ZONE selected from the plurality of zones may be, for example, a zone from the first' time t1' to the second' time t2' in FIG. 4.

In addition, referring to FIGS. 2 to 4, in order to improve the resolution of the time-to-digital converter 20 according to some example embodiments, the analog-to-digital converter 205 may be connected to the multiplexer 204. That is, the analog-to-digital converter 205 may generate time-to-digital converter output information on the time-to-digital converter input (TDC input) in the one zone N_ZONE among the plurality of zones received through the multiplexer 204. For example, the analog-to-digital converter 205 may receive the voltage information of two phase signals corresponding to the zone N_ZONE from the first' time t1' to the second' time t2' from the multiplexer 204.

The analog-to-digital converter 205 may be used, for example, for an analog-to-digital converter 205-based time-to-digital converter 20.

For example, the analog-to-digital converter 205 may use a flash analog-to-digital converter. In this case, the flash analog-to-digital converter may achieve a high conversion speed, but may require numerous comparators that increase the power consumption of the time-to-digital converter.

As another example, the analog-to-digital converter 205 may be a pipeline analog-to-digital converter. The pipeline analog-to-digital converter may require several operational amplifiers that significantly increase the power consumption of the time-to-digital converter.

As another example, the analog-to-digital converter 205 may be a successive approach register (SAR) analog-to-digital converter. The SAR analog-to-digital converter may consume less power. However, the SAR analog-to-digital converter may be restricted by a setting time, which is the time required to charge a capacitive digital-to-analog converter. To improve the setting time, a top-plate sampling may be used. This is because when the top plate sampling is used, the number of unit capacitors of the capacitive digital-to-analog converter may be reduced by half compared to a case of using a bottom-plate sampling.

Meanwhile, the top-plate sampling can increase the effect of parasitic capacitance, which can cause the SAR analog-to-digital converter to undergo clipping due to gain and full-scale errors. In addition, when using the top plate sampling, a common mode of the capacitive digital-to-analog converter may be determined by a common mode of an input signal to the analog-to-digital converter. When changing the common mode of the input signal, the speed of a comparator may also be changed to affect a conversion time of the SAR analog-to-digital converter. The change in a process, voltage, and temperature (PVT) may exacerbate problems related to clipping and the conversion time of the analog-to-digital converter.

In other words, even though the analog-to-digital converter 205 is used to improve the resolution of the time-to-digital converter 20 according to some example embodiments, the nonlinear characteristics may occur in the output of the time-to-digital converter 20 due to the clipping of the analog-to-digital converter 205.

Accordingly, the time-to-digital converter 20 according to some example embodiments includes a calibrator 210 to remove the nonlinear characteristics that may occur in the output of the time-to-digital converter 20.

The calibrator 210 may receive the loop filter input signal LF_IN generated by the time-digital converter 20 as feedback, receive an analog-digital conversion output ADC_OUT from the analog-digital converter 205, and generate a calibrated analog-digital conversion output ADC_OUT_CAL by calibrating the nonlinear characteristics included in the analog-digital conversion output ADC_OUT.

The time-to-digital converter 20 according to some example embodiments may generate the loop filter input signal LF_IN by adding the calibrated analog-to-digital conversion output ADC_OUT_CAL and the plurality of zones N_ZONE generated based on the multi-phase information and the number of oscillations N_CNT counted through the counter array 203 by the adder 207.

In other words, the time-digital converter 20 according to some example embodiments may receive feedback for the loop filter input signal LF_IN and generate the calibrated analog-to-digital conversion output ADC_OUT_CAL by calibrating the nonlinear characteristics included in the analog-to-digital conversion output ADC_OUT, thus removing the nonlinear characteristics included in the loop filter input signal LF_IN generated by the time-to-digital converter 20 via continuous feedback.

Hereinafter, a structure and an operation of removing the nonlinear characteristics included in the loop filter input signal LF_IN, which is an output of the time-digital converter 20 according to some example embodiments, via the calibrator 210, will be described in detail with reference to FIGS. 5 to 12.

Figure 5:
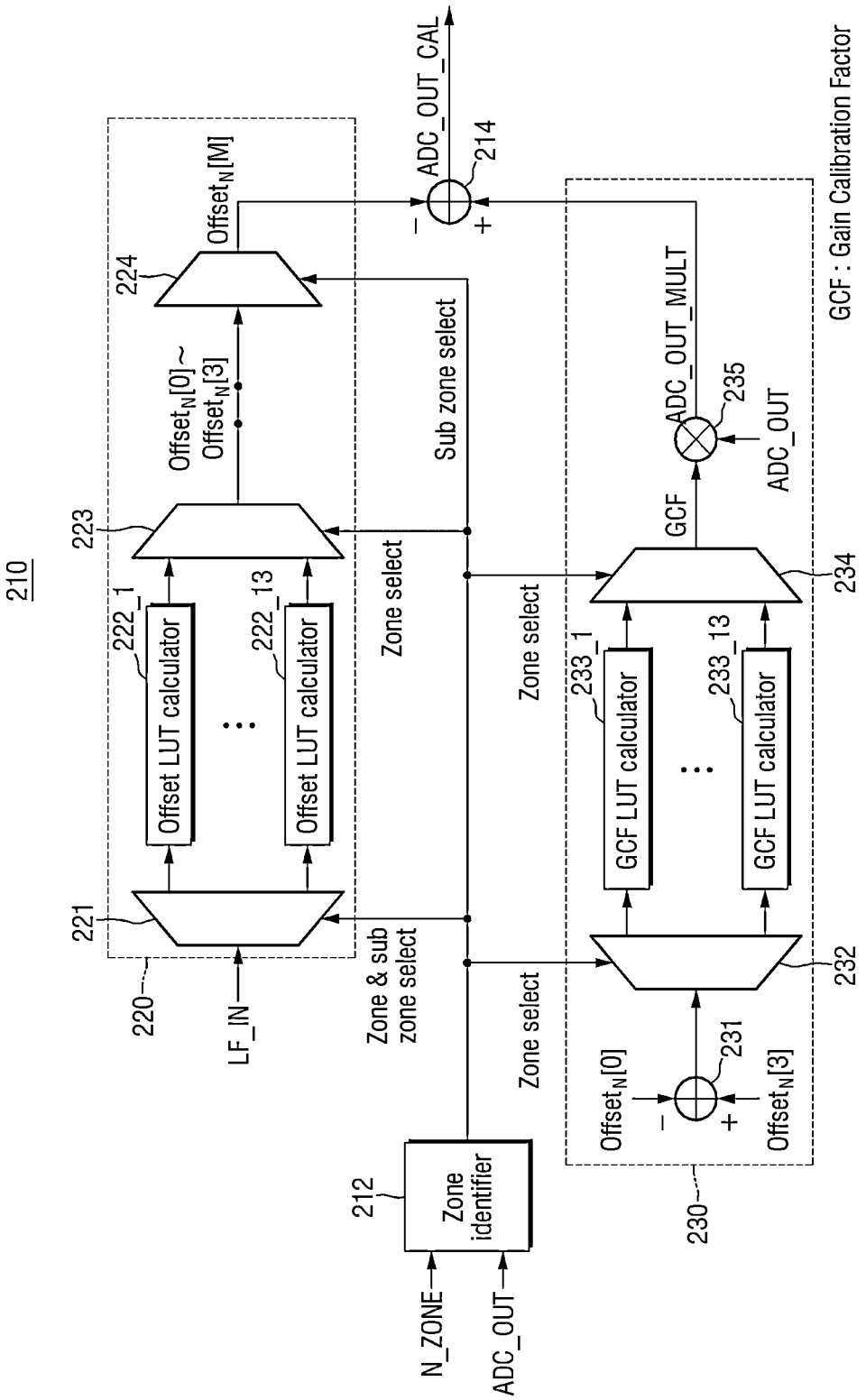
FIG. 5 is a block diagram illustrating the calibrator according to some example embodiments.

FIG. 5 is a block diagram illustrating the calibrator according to some example embodiments.

Referring again to FIGS. 2 and 5, the calibrator 210 includes a zone identifier 212, an offset lookup table generation circuit 220, a gain-corrected analog-to-digital conversion output generator (or gain-corrected analog-to-digital conversion output circuit) 230, and an adder 214.

The zone identifier 212 may receive information on the analog-to-digital conversion output ADC_OUT received from the analog-to-digital converter 205 and the one zone N_ZONE among the plurality of zones received from the counter array 203 and generate a signal for selecting one zone from the plurality of zones. In addition, a sub-zone selection signal for selecting one sub-zone from sub-zones in which one zone is divided into a plurality of zones may also be generated.

The sub-zone may be a unit obtained by dividing one zone described in FIG. 4 into the plurality of sub-zone.

In the following descriptions, it is explained that zones are divided into 13 zones and sub-zones are divided into four zones for each zone. However, this is an example, and the zones can be divided into any natural numbers, and the sub-zones may also be divided into any natural numbers for each zone.

The offset lookup table generation circuit 220 may generate an offset value applied to each zone based on a zone selection signal and/or a sub-zone selection signal received from the zone identifier 212.

For example, for a first zone that is one of the plurality of zones, an operation of the offset lookup table generation circuit 220 for the plurality of sub-zones (first sub-zone to fourth sub-zone) that are present in the first zone will be described as an example.

The offset lookup table generation circuit 220 includes a de-multiplexer 221, a plurality of offset lookup table calculators 222_1 to 222_13, a first multiplexer 223, and a second multiplexer 224.

The offset lookup table generation circuit 220 first receives the loop filter input signal LF_IN via the de-multiplexer 221. In this case, the de-multiplexer 221 may receive the zone selection signal and the sub-zone selection signal from the zone identifier 212 and transmit information included in the loop filter input signal LF_IN to each of the lookup table offset calculators 222_1 to 222_13.

In this case, each of the plurality of offset lookup table calculators 222_1 to 222_13 calculates offset errors for each of the plurality of zones during the first pulse width at which the ring oscillator 201 oscillates, and stores the offset errors as lookup tables. For example, a first offset lookup table calculator 222_1 may store the offset error generated in the first zone as a lookup table, and the $13^{th}$ zone offset lookup table calculator 222_13 may store the offset error generated in the $13^{th}$ zone as a lookup table.

The offset error may be a difference value between an ideal time-digital converter output and the time-digital converter output with the nonlinear characteristics, described with reference to FIG. 4. For example, the offset error may be a value obtained by subtracting the average in each zone of the time-to-digital converter output with the nonlinear characteristics from the average in each zone of the ideal time-to-digital converter output.

Figure 6:
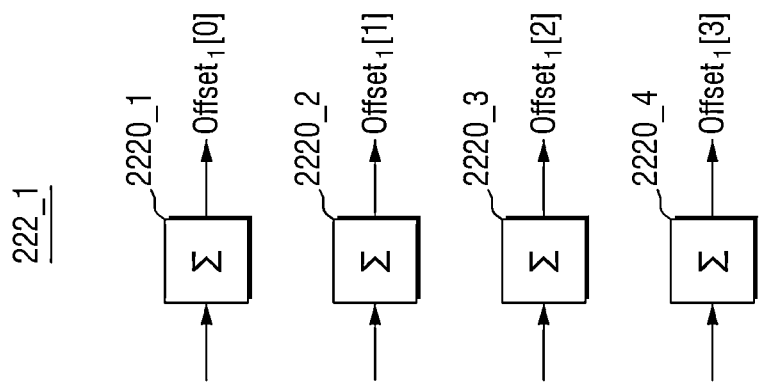
FIG. 6 is a is a block diagram illustrating an offset lookup table calculator according to some example embodiments.

Each of the plurality of offset lookup table calculators 222_1 to 222_13 may be configured as illustrated in FIG. 6. Even though FIG. 6 describes the first offset lookup table calculator 222_1 as an example, a description thereof may be applied to a description of the remaining offset lookup table calculators 222_2 to 222_13.

FIG. 6 is a block diagram illustrating an offset lookup table calculator according to some example embodiments.

Referring to FIGS. 5 and 6, the first offset lookup table calculator 222_1 may include a plurality of aggregators 2220_1 to 2220_4. Each of the plurality of aggregators 2220_1 to 2220_4 may calculate offset errors for each of the sub-zones included in the first zone. In other words, each of the plurality of aggregators 2220_1 to 2220_4 may calculate the offset errors for each of the first to fourth sub-zone.

Thereafter, the offset errors calculated via each of the plurality of aggregators 2220_1 to 2220_4 may be stored in offset lookup tables (Offset$_1$[0] to Offset$_1$[3]), respectively. For example, it may be stored in a register included in the first offset lookup table calculator 222_1. In other words, each of the offset lookup tables (Offset$_1$[0] to Offset$_1$[3]) may be a value in which the offset errors for the first to fourth sub-zones for the first zone are stored as the lookup tables.

Referring back to FIGS. 2 and 5, the first multiplexer 223 receives the zone selection signal from the zone identifier 212, select one of the 1$^{st}$ to 13$^{th}$ zones, and transmits lookup table values for the corresponding zones to the second multiplexer 224.

For example, when an Nth zone selection signal is received from the zone identifier 212, the first multiplexer 223 may transmit offset lookup tables (Offset$_N$[0] to Offset$_N$[3]) calculated and stored for the plurality of sub-zones for an Nth zone to the second multiplexer 224.

The second multiplexer 224 may select one of the lookup tables (Offset$_N$[0] to Offset$_N$[3]) based on the sub-zone selection signal received from the zone identifier 212 and transmit the selected lookup table as an offset lookup table error value to the adder 214.

The gain-corrected analog-to-digital conversion output generator 230 may generate a gain-corrected analog-to-digital conversion output ADC_OUT_MULT that offsets a difference between the first gain having the ideal time-to-digital converter output and the second gain having the time-to-digital converter output with the nonlinear characteristics.

For example, the gain-corrected analog-to-digital conversion output generator (or gain-corrected analog-to-digital conversion output generator circuit) 230 includes an adder 231, a de-multiplexer 232, a plurality of gain calibration factor calculators (or gain calibration factor calculator circuits) 233_1 to 233_13, a multiplexer 234, and a multiplier 235.

The gain-corrected analog-to-digital conversion output generator 230 may receive two offset lookup tables for each zone and obtain a difference between the two offset lookup tables.

For example, the gain-corrected analog-to-digital conversion output generator 230 may receive the offset lookup table Offset$_N$[0] of the first sub-zone for the Nth zone and the offset lookup table Offset$_N$[3] of the fourth sub-zone for the Nth zone and transmit the same to an Nth gain calibration factor calculator via the de-multiplexer 232.

In other words, since N is a natural number between 1 and 13, offset lookup table values may be received for the two sub-zones for each of a total of 13 zones, and a difference value between the offset lookup table values may be transmitted to each of the gain calibration factor calculators 233_1 to 233_13 via the de-multiplexer 232.

In this case, the de-multiplexer 232 may transmit the differences between the offset lookup table values to the gain calibration factor calculators 233_1 to 233_13 based on the zone selection signal received by the zone identifier 212.

The two offset lookup tables in which the gain-corrected analog-to-digital conversion output generator 230 obtains the differences through the adder 231 are not limited to the first and fourth sub-zones of each of the zones. In addition, the number of offset lookup tables received by the gain-corrected analog-to-digital conversion output generator 230 through the adder 231 is not limited to two.

As described in FIG. 4, the sub-zones are sufficient that can obtain the difference between the first gain having the ideal time-digital converter output and the second gain having the time-digital converter output with the nonlinear characteristics.

Each of the plurality of gain correction coefficient calculators 233_1 to 233_13 may be adders. In other words, each of the plurality of gain calibration factor calculators 233_1 to 233_13 may calculate the difference between the first gain having the ideal time-digital converter output and the second gain having the time-digital converter output with the nonlinear characteristics, through the adder, as described in FIG. 4, and generate a gain calibration factor (GCF) for each of the plurality of zones.

Thereafter, the multiplexer 234 may output the gain correction coefficient GCF for one zone, using the zone selection signal received by the zone identifier 212, and transmit the same to the multiplier 235.

The multiplier 235 that has received the analog-to-digital conversion output ADC_OUT transmits the gain-corrected analog-to-digital conversion output ADC_OUT_MULT, which is an output for applying the gain calibration factor to each of the zones, to the adder 214.

The adder 214 may generate and output a calibrated analog-to-digital conversion output ADC_OUT_MULT by applying the gain-corrected analog-to-digital conversion output (ADC_OUT_CAL) and an output to which the offset lookup table (Offset$_N$[M]) is applied.

Hereinafter, an operation of the time-to-digital converter according to some example embodiments will be described together with graphs.

Figure 7:
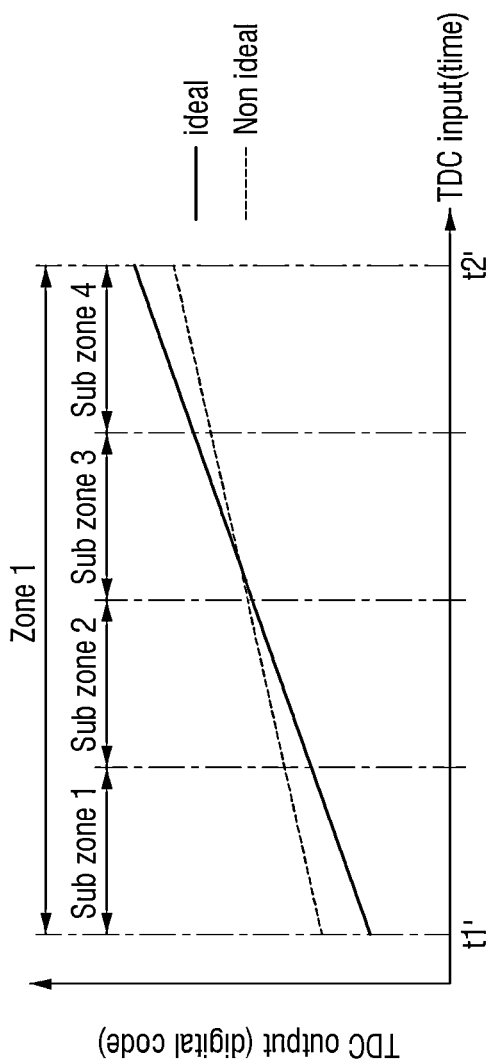
FIG. 7 is an example graph explaining an output for an input of a time-to-digital converter in the first zone.
Figure 8:
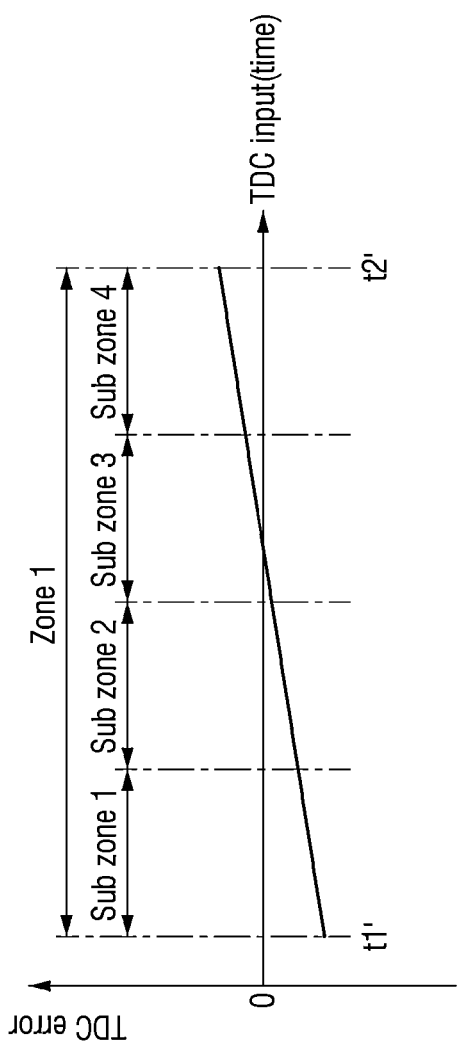
FIG. 8 is an example graph explaining a difference between an ideal output and a nonlinear output for an input of the time-digital converter in the first zone.
Figure 9:
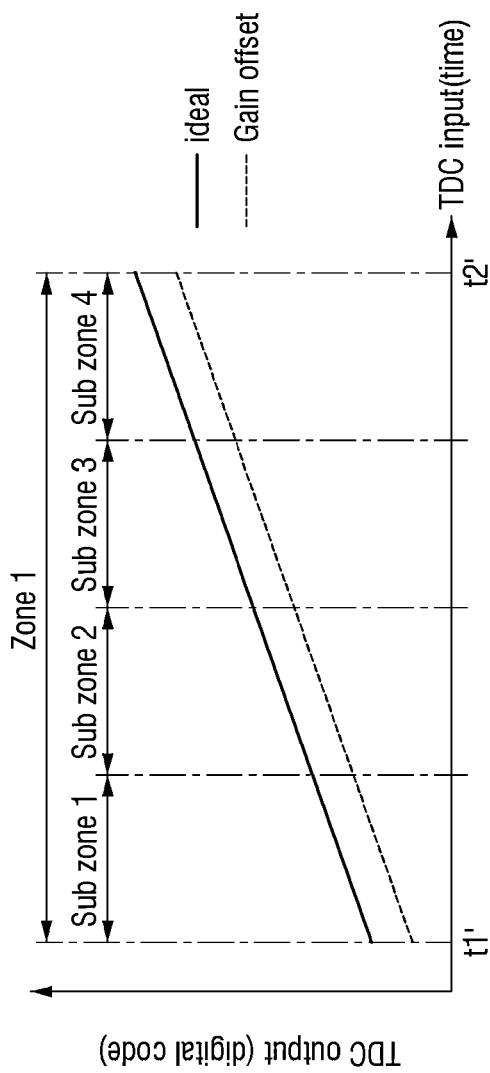
FIG. 9 is an example graph explaining a calibrated result using the gain calibration factor for the nonlinear output via the time-to-digital converter according to some example embodiments.
Figure 10:
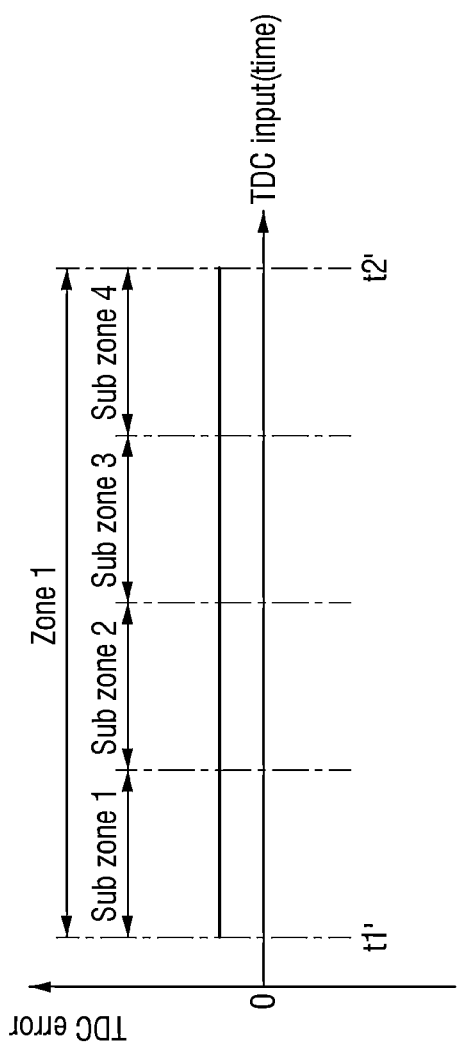
FIG. 10 is an example graph explaining the difference between the ideal output and the nonlinear output after calibration using the gain calibration factor for the nonlinear output via the time-digital converter according to some example embodiments.

FIG. 7 is an example graph explaining an output for an input of a time-to-digital converter in the first zone. FIG. 8 is an example graph explaining a difference between an ideal output and a nonlinear output for an input of the time-digital converter in the first zone. FIG. 9 is an example graph explaining a calibrated result using the gain calibration factor for the nonlinear output via the time-to-digital converter according to some example embodiments. FIG. 10 is an example graph explaining the difference between the ideal output and the nonlinear output after calibration using the gain calibration factor for the nonlinear output via the time-digital converter according to some example embodiments.

Referring to FIGS. 4, 5, 7, and 8, as the output for the time-digital converter input, the time-digital converter output may have the time-digital converter output with the nonlinear characteristics different from the ideal time-digital converter output.

In other words, a time-digital converter error obtained by subtracting a time-digital converter output value with the nonlinear characteristics from the ideal time-digital converter output may occur as illustrated in FIG. 8.

In this case, the gain calibration factors may be calculated for each of the plurality of zones through the gain-corrected analog-to-digital conversion output generator 230, and the time-to-digital converter output with the nonlinear characteristics may be multiplied by the analog-to-digital conversion output and the gain calibration factor. Accordingly, a gain of the time-to-digital converter output with the nonlinear characteristics may be made equal to that of the ideal time-to-digital converter output, as illustrated in FIG. 9.

Therefore, as illustrated in FIG. 10, the same time-to-digital converter error value may occur for each of the plurality of sub-zones.

Figure 11:
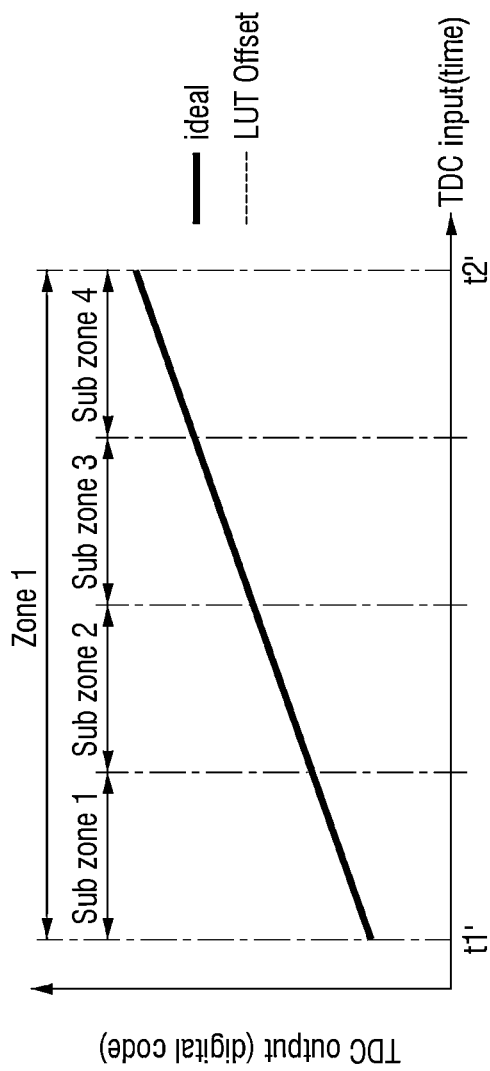
FIG. 11 is an example graph explaining a result of calibration using an offset lookup table for a nonlinear output via a time-digital converter according to some example embodiments.
Figure 12:
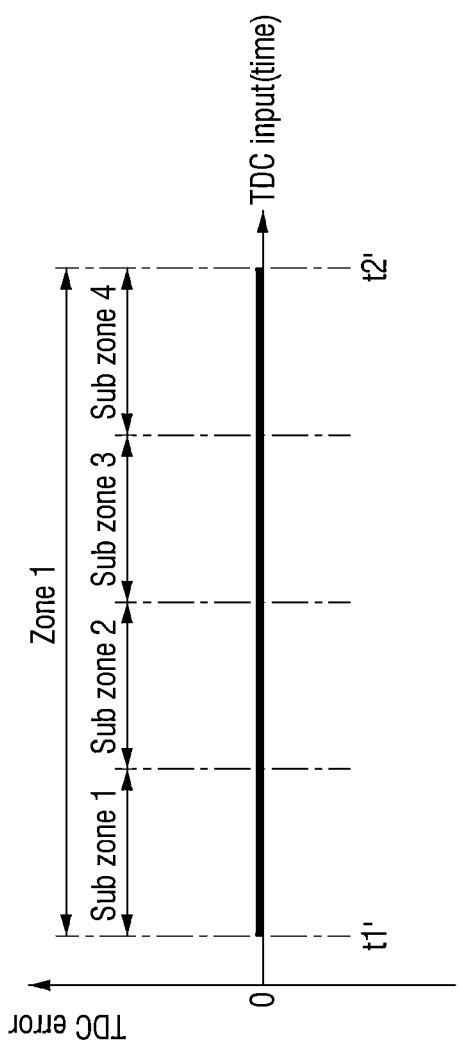
FIG. 12 is an example graph explaining a difference between an ideal output and a nonlinear output after calibration using an offset lookup table for the nonlinear output via the time-digital converter according to some example embodiments.

FIG. 11 is an example graph explaining a calibrated result using an offset lookup table for a nonlinear output via a time-digital converter according to some example embodiments, and FIG. 12 is an example graph explaining a difference between an ideal output and a nonlinear output after calibration using an offset lookup table for the nonlinear output via the time-digital converter according to some example embodiments.

In addition, referring to FIGS. 5 and 11, through the offset lookup table generation circuit 220, the offset lookup table error values in which the offset errors for each of the sub-zone in the plurality of zones are obtained and stored may be added through the adder 214, and accordingly, the ideal time-digital converter output and the time-digital converter output with the nonlinear characteristics may have the same value as illustrated in FIG. 11.

In other words, as illustrated in FIG. 12, the time-digital converter error between the time-digital converter output with the nonlinear characteristics and the ideal time-digital converter output may be eliminated to remove nonlinearity that occurs in the loop filter input signal LF_IN generated by the time-digital converter 20.

Although the example embodiments of the present disclosure have been described above with reference to the accompanying drawings, the present disclosure is not limited to the disclosed example embodiments, but may be implemented in various different ways, and the present disclosure may be embodied in many different forms without changing technical subject matters and essential features as will be understood by those skilled in the art. Therefore, example embodiments set forth herein are exemplary only and not to be construed as a limitation.

What is claimed is:

1. A time-to-digital converter, comprising:
a phase frequency detector configured to receive a phase-locked loop input clock and a feedback clock and generate an enable signal during a first pulse width in which a phase error occurs between the phase-locked loop input clock and the feedback clock;
a ring oscillator configured to be turned on based on the enable signal and configured to perform oscillation with multi-phase clocks of a first period;
a counter array configured to count a number of oscillations in which the ring oscillator oscillates in the first period by the number of positive integers during the first pulse width;
a multiplexer configured to divide the first period into a plurality of zones using edge information of the multi-phase clocks of the ring oscillator, and selects and outputs voltage information of a plurality of neighboring phase clocks included in a first zone from the plurality of zones;
an analog-to-digital converter configured to generate an analog-to-digital conversion output by receiving the voltage information included in the first zone as an input;
a calibrator configured to receive the analog-to-digital conversion output and a loop filter input signal and generate a calibrated analog-to-digital conversion output by calibrating the analog-to-digital conversion output; and
a first adder configured to output the loop filter input signal by receiving the first zone, the number of oscillations, and the calibrated analog-to-digital conversion output,
wherein the calibrator comprises
an offset lookup table generation circuit configured to receive the loop filter input signal and generate a plurality of offset lookup tables that offset an error between an ideal digital code value and a nonlinear digital code value over time of the loop filter input signal,
a gain-corrected analog-to-digital conversion output generator circuit configured to generate a gain-corrected analog-to-digital conversion output that offsets a difference between a first gain having the ideal digital code value and a second gain with the nonlinear digital code value, and
a second adder configured to generated the calibrated analog-to-digital conversion output by adding the offset lookup table and the gain-corrected analog-to-digital conversion output.

2. The time-to-digital converter of claim 1, wherein the calibrator further comprises a zone identifier configured to generate a first zone selection signal by receiving the first zone and the analog-to-digital conversion output.

3. The time-to-digital converter of claim 2, wherein the zone identifier generates a first sub-zone selection signal for selecting a first sub-zone from a plurality of sub-zones included in the first zone.

4. The time-to-digital converter of claim 1, wherein a gain-corrected factor generation circuit further comprises a third adder configured to calculate a difference between two offset lookup tables among the plurality of offset lookup tables.

5. The time-to-digital converter of claim 4, wherein the gain-corrected analog-to-digital conversion output generator circuit further comprises a calibration factor calculator circuit configured to offset a difference between the first gain and the second gain using a difference between the two offset lookup tables among the plurality of offset lookup tables.

6. The time-to-digital converter of claim 5, wherein the gain-corrected analog-to-digital conversion output generator circuit further comprises a multiplier configured to output the gain-corrected analog-to-digital conversion output by multiplying a gain calibration factor (GCF) that offsets a difference between the first gain and the second gain calculated by the calibration factor calculator circuit by the analog-to-digital conversion output.

7. The time-to-digital converter of claim 6,
wherein the plurality of offset lookup tables and the gain calibration factor are generated in parallel.

8. A digital phase-locked loop circuit comprising:
a time-to-digital converter for generating a loop filter input signal, the digital phase-locked loop circuit comprising:
    the time-to-digital converter configured to generate the loop filter input signal by receiving a phase-locked loop input clock and a feedback clock,
    a loop filter configured to generate an output signal by receiving the loop filter input signal,
    an oscillator configured to generate an oscillation clock by receiving the output signal, and
    a divider configured to generates the feedback clock that divides a frequency of the oscillation clock by receiving the oscillation clock, wherein the time-to-digital converter comprises
    a phase frequency detector configured to receive the phase-locked loop input clock and the feedback clock and output an enable signal during a first pulse width in which a phase error occurs between the phase-locked loop input clock and the feedback clock,
    a ring oscillator configured to be turned on based on the enable signal and configured to perform oscillation with multi-phase clocks of a first period,
    a counter array configured to count a number of oscillations in which the ring oscillator oscillates in the first period by the number of positive integers during the first pulse width,
    a multiplexer configured to divide the first period into a plurality of zones using edge information of the multi-phase clocks of the ring oscillator, and selects and outputs voltage information of a plurality of neighboring phase clocks included in a first zone from the plurality of zones,
    an analog digital converter configured to generate an analog-to-digital conversion output by receiving the voltage information included in the first zone as an input,
    a calibrator configured to receive the analog-to-digital conversion output and the loop filter input signal and generate a calibrated analog-to-digital conversion output by calibrating the analog-to-digital conversion output; and
    a first adder configured to output the loop filter input signal by receiving the first zone, the number of oscillations, and the calibrated analog-to-digital conversion output, and
wherein the calibrator comprises,
    an offset lookup table generation circuit configured to receive the loop filter input signal and generate a plurality of offset lookup tables that offset an error between an ideal digital code value and a nonlinear digital code value over time of the loop filter input signal,
    a gain-corrected analog-to-digital conversion output generator circuit configured to generate a gain-corrected analog-to-digital conversion output that offsets a difference between a first gain having the ideal digital code value and a second gain with the nonlinear digital code value, and
    a second adder configured to generate the calibrated analog-to-digital conversion output by adding the offset lookup table and the gain-corrected analog-to-digital conversion output.

9. The digital phase-locked loop circuit of claim 8, further comprising a zone identifier configured to generate a first zone selection signal by receiving the first zone and the analog-to-digital conversion output.

10. The digital phase-locked loop circuit of claim 9, wherein the zone identifier generates a first sub-zone selection signal for selecting a first sub-zone from a plurality of sub-zones included in the first zone.

11. The digital phase-locked loop circuit of claim 8, wherein the gain-corrected analog-to-digital conversion output generator circuit further comprises a third adder configured to calculate a difference between two offset lookup tables among the plurality of offset lookup tables.

12. The digital phase-locked loop circuit of claim 8, wherein the gain-corrected analog-to-digital conversion output generator circuit further comprises a calibration factor calculator circuit configured to offset a difference between the first gain and the second gain using a difference between two offset lookup tables among the plurality of offset lookup tables.

13. The digital phase-locked loop circuit of claim 12, wherein the gain-corrected analog-to-digital conversion output generator circuit further comprises a multiplier configured to output the gain-corrected analog-to-digital conversion output by multiplying a gain calibration factor (GCF) that offsets a difference between the first gain and the second gain calculated by the calibration factor calculator circuit by the analog-to-digital conversion output.

14. The digital phase-locked loop circuit of claim 13, wherein the plurality of offset lookup tables and the gain calibration factor are generated in parallel.

15. A calibrator included in a digital phase-locked loop circuit, the calibrator configured to calibrate a loop filter input signal of a time-to-digital converter outputting the loop filter input signal based on an analog to digital conversion, the calibrator comprising,
    an offset lookup table generation circuit configured to receive the loop filter input signal and generate a plurality of offset lookup tables that offset an error between an ideal digital code value and a nonlinear digital code value over time of the loop filter input signal;
    a gain-corrected analog-to-digital conversion output generator circuit configured to generate a gain-corrected analog-to-digital conversion output that offsets a difference between a first gain having the ideal digital code value and a second gain with the nonlinear digital code value; and
    a first adder configured to generate a calibrated analog-to-digital conversion output by calibrating an analog-to-digital conversion output by adding the offset lookup table and the gain-corrected analog-to-digital conversion output,
wherein the calibrator is configured to output the calibrated analog-to-digital conversion output to the time-to-digital converter for calibrating the loop filter input signal using the calibrated analog-to-digital conversion output.

16. The calibrator of claim 15, wherein the gain-corrected analog-to-digital conversion output generator circuit is configured to divide a first period into a plurality of zones for a plurality of phase clocks during the first period generated via a ring oscillator, and calculate a gain calibration factor based on the analog-to-digital conversion output generated by receiving voltage information of a plurality of neighboring phase clocks included in a first zone of the plurality of zones as an input and a first selection signal generated by receiving the first zone.

17. The calibrator of claim 16, wherein the gain-corrected analog-to-digital conversion output generator circuit further comprises:
- a calibration factor calculator circuit configured to offset a difference value between the first gain and the second gain; and
- a multiplier configured to output the gain-corrected analog-to-digital conversion output by multiplying the gain calibration factor (GCF) for correcting a difference value between the first gain and the second gain, by the analog-to-digital conversion output.

18. The calibrator of claim 15, wherein the gain-corrected analog-to-digital conversion output generator circuit further comprises a second adder configured to calculate a difference between two offset lookup tables among the plurality of offset lookup tables.

19. The calibrator of claim 15, wherein the gain-corrected analog-to-digital conversion output generator circuit further comprises a calibration factor calculator circuit configured to offset a difference between the first gain and the second gain using a difference between two offset lookup tables among the plurality of offset lookup tables.

20. The calibrator of claim 16, wherein the plurality of offset lookup tables and the gain calibration factor are generated in parallel.

* * * * *